(12) United States Patent
Lin et al.

(10) Patent No.: US 8,822,277 B2
(45) Date of Patent: Sep. 2, 2014

(54) METHOD FOR MANUFACTURING LIGHT EMITTING DIODE PACKAGE

(71) Applicant: Advanced Optoelectronic Technology, Inc., Hsinchu Hsien (TW)

(72) Inventors: Hou-Te Lin, Hsinchu (TW); Lung-Hsin Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/903,976

(22) Filed: May 28, 2013

(65) Prior Publication Data
US 2013/0337594 A1 Dec. 19, 2013

(30) Foreign Application Priority Data

Jun. 14, 2012 (CN) .......................... 2012 1 01960451

(51) Int. Cl.
*H01L 21/00* (2006.01)
(52) U.S. Cl.
USPC ...................... 438/123; 438/33; 257/E23.053
(58) Field of Classification Search
None
See application file for complete search history.

(56) References Cited

U.S. PATENT DOCUMENTS

2009/0095969 A1* 4/2009 Kotani et al. .................. 257/98

* cited by examiner

*Primary Examiner* — Whitney T Moore
*Assistant Examiner* — Joseph Galvin, III
(74) *Attorney, Agent, or Firm* — Novak Druce Connolly Bove + Quigg LLP

(57) ABSTRACT

A method for manufacturing LED packages includes following steps: providing an engaging frame including a lead frame, electrode structures having first and second electrodes, and defining slots between the electrode structure, each first electrode including a first inserting part and each second electrode including a second inserting part; providing a substrate and combining the substrate and the engaging frame together to make through holes of the substrate located at lateral sides of the first and second inserting parts respectively, insulating parts of the substrate received in the slots of the engaging frame, and cavities of the substrate receiving the first and second inserting parts; providing LED diodes, and connecting each LED diode electrically to the first and second electrodes; and cutting along the first and second inserting parts to make sides of the first and second inserting parts exposed to ambient air.

10 Claims, 17 Drawing Sheets

```
┌─────────────────────────────────────────────────┐
│ Providing an engaging frame, the engaging frame │
│ comprising a lead frame, a plurality of electrode│
│ structures enclosed in the lead frame, and defining│——S1
│ a plurality of receiving slots between the electrode│
│ structures, each electrode structure comprising a│
│ first inserting part and a second inserting part│
└─────────────────────────────────────────────────┘
                         ↓
┌─────────────────────────────────────────────────┐
│ Providing a substrate, the substrate comprising a│
│ plurality of insulating parts and defining a plurality│——S2
│ of receiving cavities and through holesinserting part│
│ and a second inserting part                     │
└─────────────────────────────────────────────────┘
                         ↓
┌─────────────────────────────────────────────────┐
│ Engaging the substrate and the engaging frame   │
│ together to make the through holes of the       │
│ substrate located at lateral sides of the first │
│ inserting parts and the second inserting parts  │——S3
│ respectively, the insulating parts of the substrate│
│ received in the corresponding receiving slots of the│
│ engaging frame, the receiving cavities of the   │
│ substrate receiving the corresponding first inserting│
│ parts and the second inserting parts            │
└─────────────────────────────────────────────────┘
                         ↓
┌─────────────────────────────────────────────────┐
│ Providing a plurality of LED diodes, and connecting│
│ each LED diode electrically to the first electrode│——S4
│ and the second electrode respectively at a bottom│
│ end of each through hole                        │
└─────────────────────────────────────────────────┘
                         ↓
┌─────────────────────────────────────────────────┐
│ Forming an encapsulating layer in each through  │——S5
│ hole to encapsulate the LED chip                │
└─────────────────────────────────────────────────┘
                         ↓
┌─────────────────────────────────────────────────┐
│ Cutting along the first inserting parts and the │
│ second inserting parts to make a side of the first│——S6
│ inserting parts and second inserting parts exposed│
│ to ambient air                                  │
└─────────────────────────────────────────────────┘
```

METHOD FOR MANUFACTURING LIGHT EMITTING DIODE PACKAGE

BACKGROUND

1. Technical Field

The disclosure generally relates to semiconductors, particularly, to a method for manufacturing a light emitting diode package, wherein the light emitting diode can be used as a side view light emitting diode package.

2. Description of Related Art

Light emitting diodes (LEDs) have many advantages, such as high luminosity, low operational voltage, low power consumption, compatibility with integrated circuits, faster switching, long term reliability, and environmental friendliness which have promoted their wide use as a light source.

A conventional method for manufacturing an LED package includes following steps: providing a substrate; forming a first electrode and a second electrode on the substrate, respectively; providing an LED diode, the LED diode electrically connecting the first electrode and the second electrode respectively, each of the two electrodes has a protruding end exposed at a bottom of the substrate to electrically connect a circuit.

Due to the increased power of modern LED package manufactured by the conventional method, a great amount of heat is generated by a typical LED package when working, and the heat can be dissipated out only from the exposed ends of the two electrodes. As such, the heat-dissipating efficiency is decreased, resulting in the lifespan of the LED package shorten. Therefore, how to efficiently dissipate heat generated from LED packages has become an important topic of a general concern to the industry.

What is needed, therefore, is a method for manufacturing LED packages which can overcome the above described shortcomings

BRIEF DESCRIPTION OF THE DRAWINGS

FIG. 1 is a flowchart of a method for manufacturing an LED package in accordance with a first exemplary embodiment of the present disclosure.

DETAILED DESCRIPTION

Figure 2:
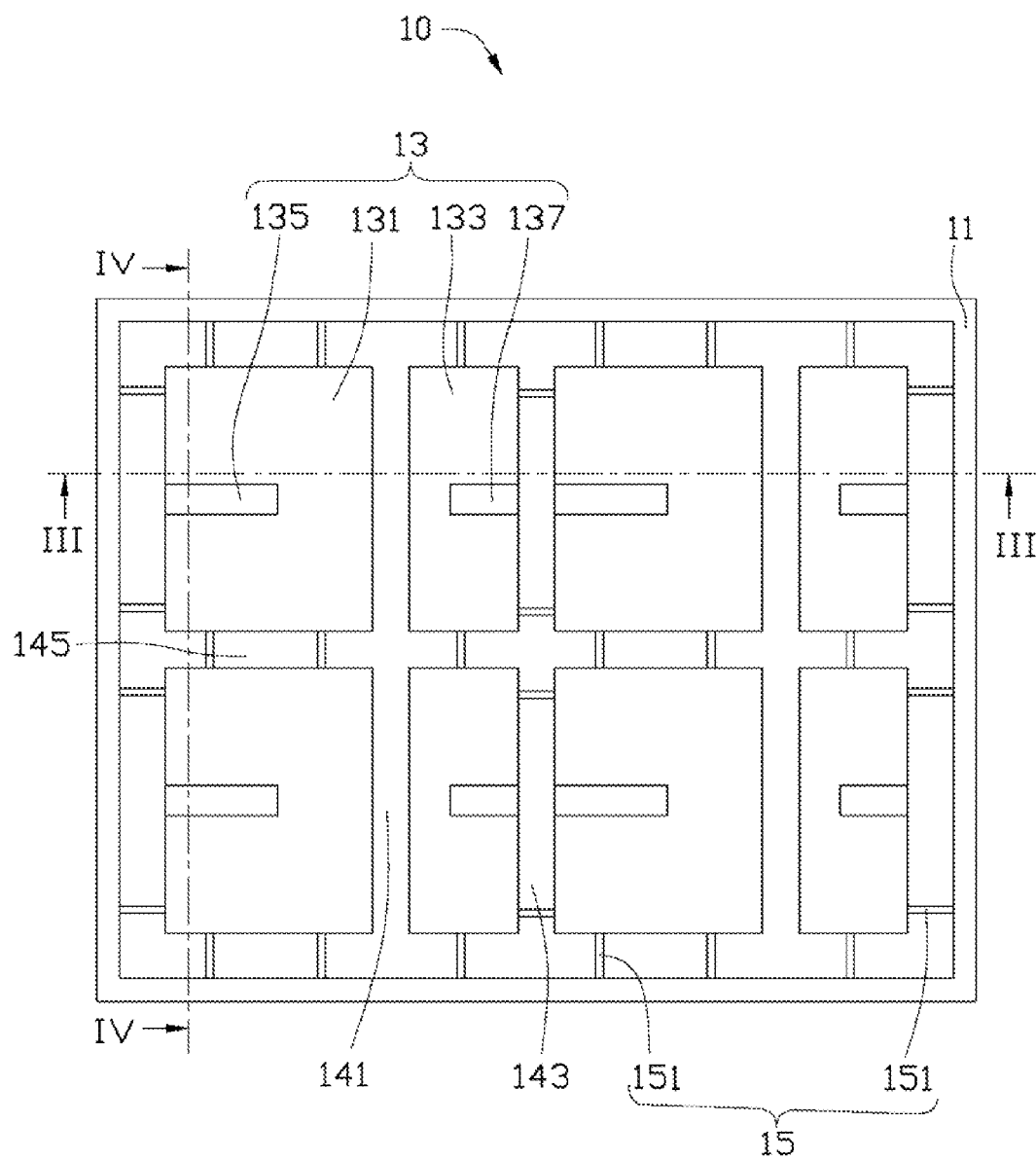
FIG. 2 is a top plan view of an engaging frame according to a first step of the method for manufacturing the LED package.
Figure 3:
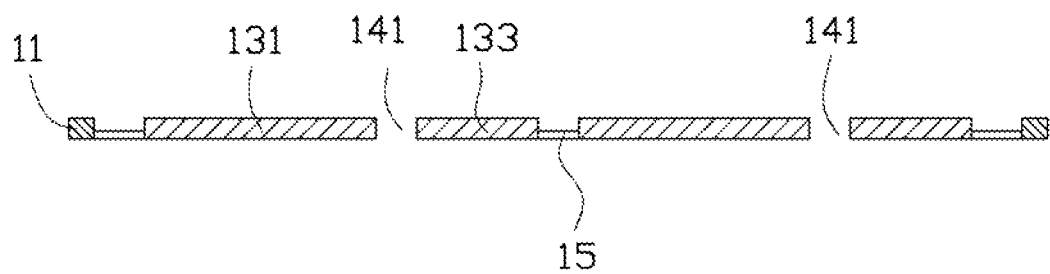
FIG. 3 is a cross-sectional view of the engaging frame of FIG. 2, taken along line thereof.
Figure 4:
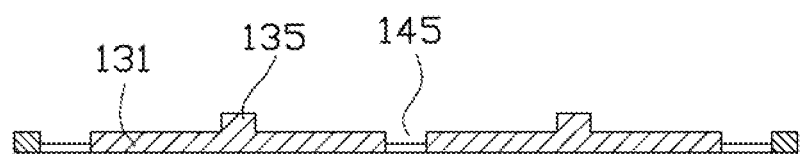
FIG. 4 is a cross-sectional view of the engaging frame of FIG. 2, taken along line IV-IV thereof.

Referring to FIG. 1, a method for manufacturing LED packages (shown in FIGS. 2-16) in accordance with a first exemplary embodiment of the present disclosure includes the following steps:

Referring also to FIGS. 2-4, the first step is providing an engaging frame 10.

The engaging frame 10 includes a rectangular lead frame 11, a plurality of electrode structures 13, and a bracket 15 connecting the electrode structures 13 to the lead frame 11. The lead frame 11 encloses the electrode structures 13 and the bracket 15. The lead frame 11 is made of metallic material, such as copper.

The electrode structures 13 are spaced from each other, and are arranged in rows along a longitudinal direction of the engaging frame 10. In this embodiment, the number of the electrode structures 13 enclosed by the lead frame 11 is four, and the electrode structures 13 are also arranged in two rows along a traverse direction of the engaging frame 10.

Each electrode structure 13 includes a first electrode 131 and a second electrode 133. The first electrode 131 and the second electrode 133 are separate, and are arranged along the longitudinal direction of the engaging frame 10.

A first receiving slot 141 is defined between the first electrode 131 and the second electrode 133 of each electrode structure 13. Each first receiving slot 141 extends along a transverse direction of the engaging frame 10. A second receiving slot 143 is defined between two adjacent electrode structures 13 along the longitudinal direction of the engaging frame 10. The second receiving slot 143 extends along the transverse direction of the engaging frame 10. A third receiving slot 145 is defined between two adjacent electrode structures 13 along the transverse direction of the engaging frame 10. The third receiving slot 145 extends along the longitudinal direction of the engaging frame 10. The first receiving slots 141 and the second receiving slot 143 intersect with the third receiving slot 145.

A first inserting part 135 extends upwardly and vertically from a central portion of a top surface of the first electrode 131. The first inserting part 135 extends longitudinally from a left edge of the top surface of the first electrode 131 rightward to a middle of the first electrode 131. The left end face of the inserting part 135 is coplanar with a left end face of the first electrode 131. A length of the first inserting part 135 extending longitudinally from the left edge of the first electrode 131 toward the right end of the first electrode 131, is shorter than that of the first electrode 131 along a longitudinal direction of the engaging frame 10. In this embodiment, the first inserting part 135 is a rectangular parallelepiped.

Similarly, a second inserting part 137 extends upwardly and vertically from a central portion of a top surface of the second electrode 137. The second inserting part 137 extends longitudinally from a right edge of a top surface of the second electrode 133 leftward to a middle of the second electrode 133. A right end face of the inserting part 137 is coplanar with a corresponding right end face of the second electrode 133. A length of the second inserting part 137 extending longitudinally from the right edge of the second electrode 133 toward the left end of the second electrode 133, is shorter than that of the second electrode 133 along a longitudinal direction of the engaging frame 10. In this embodiment, the second inserting part 137 is a rectangular parallelepiped, and the second inserting part 137 is aligned with the first inserting part 135.

Preferably, a height of each first inserting part 135 is larger than that of the corresponding first electrode 131, and a height of each second inserting part 137 is larger than that of the corresponding second electrode 133. Alternatively, the first inserting part 135 can be integrally formed with the first electrode 131 as a single monolithic piece, and the second inserting part 137 can be integrally formed with the second electrode 135 as a single monolithic piece.

The bracket 15 includes a plurality of connecting bars 151. The electrode structures 13 are connected to the lead frame 11 by the plurality of connecting bars 151, respectively.

Figure 5:
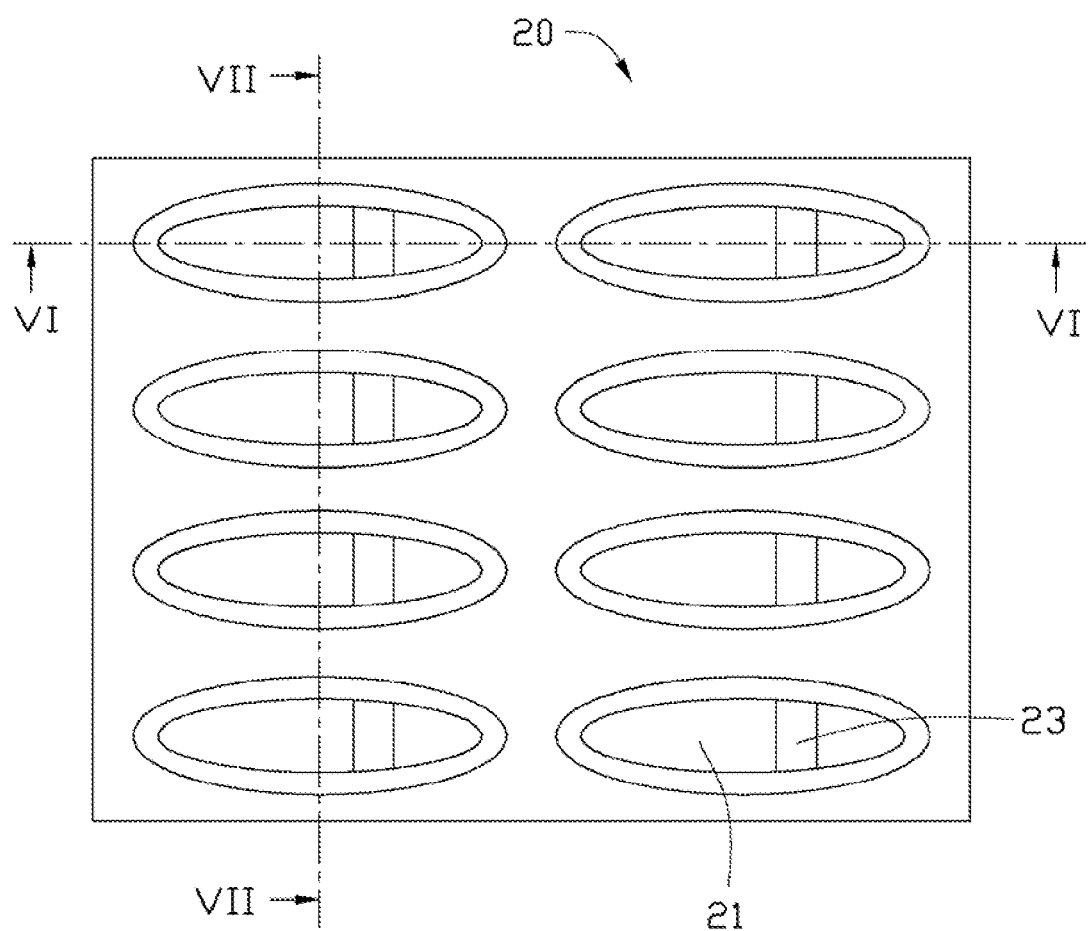
FIG. 5 is a top plan view of a substrate according to a second step of the method for manufacturing the LED package.
Figure 6:
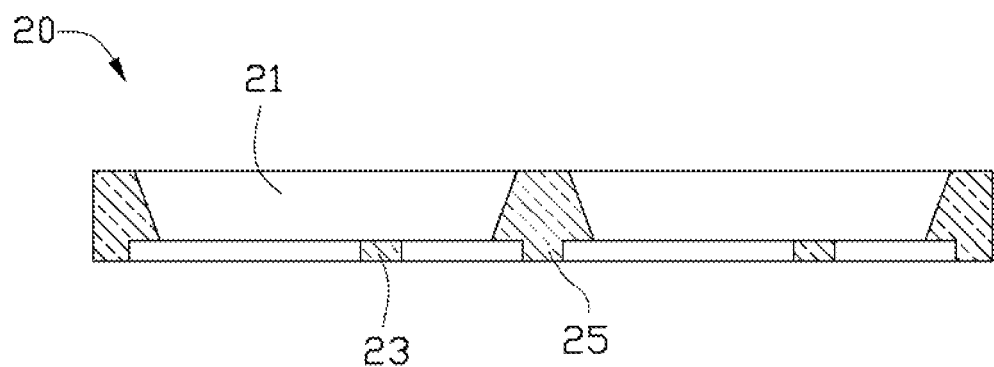
FIG. 6 is a cross-sectional view of the substrate of FIG. 5, taken along line VI-VI thereof.
Figure 7:
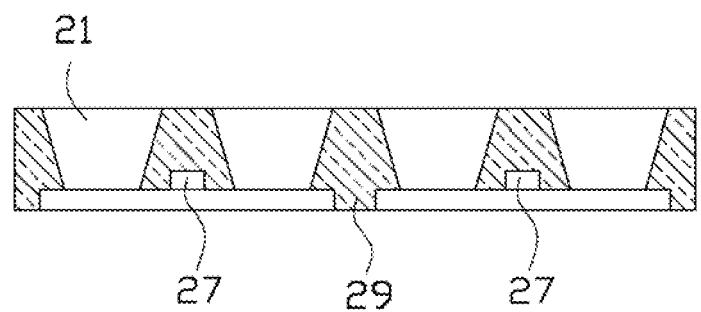
FIG. 7 is a cross-sectional view of the substrate of FIG. 5, taken along line VII-VII thereof.

Referring to FIGS. 5-7, the second step is providing a substrate 20. The substrate 20 is made of silicone resin, silicone, epoxy or polymeric materials. The substrate 20 is cuboid-shaped. A plurality of through holes 21 is defined in the substrate 20. In this embodiment, the number of the through holes 21 is eight, and the through holes 21 are arranged in four rows along a traverse direction of the substrate 20. A top end and a bottom end of each through hole 21 are oval-shaped. A size of each through hole 21 tapers from the top end to the bottom end thereof.

A first insulating part 23 is located in a bottom of each through hole 21. Each first insulating part 23 is elongate and extends along the transverse direction of the substrate 20. Each first insulating part 23 is corresponding with one respective first receiving slot 141 of the engaging frame 10.

A second insulating part 25 is formed at a bottom portion of the substrate 20. The second insulating part 25 is located between two adjacent through holes 21 along a longitudinal direction of the substrate 20, and the second insulating part 25 extends along the transverse direction of the substrate 20 (shown in FIG. 6). The second insulating part 25 is corresponding with the second receiving slot 143.

Referring to FIG. 7, two first receiving cavities 27 are defined in a bottom face of the substrate 20. One of the first receiving cavities 27 extends between a first row and a second row of the through holes 21 and along the longitudinal direction of the substrate 20. The other first receiving cavity 27 extends between a third row and a fourth row of the through holes 21 and along the longitudinal direction of the substrate 20. Each first receiving cavity 27 is corresponding with two first inserting parts 135 arranged in a line along the longitudinal direction of the lead frame 11.

Furthermore, each first receiving cavity 27 is also corresponding to two second inserting parts 137 arranged in a line with the two aligned first inserting parts 135 along the longitudinal direction of the lead frame 11.

A third insulating part 29 is formed at the bottom portion of the substrate 20. The third insulating part 29 is located between the second row and the third row of the through holes 21. The third insulating part 29 extends along the longitudinal direction of the substrate 20, and is corresponding with the third receiving slot 145.

Figure 8:
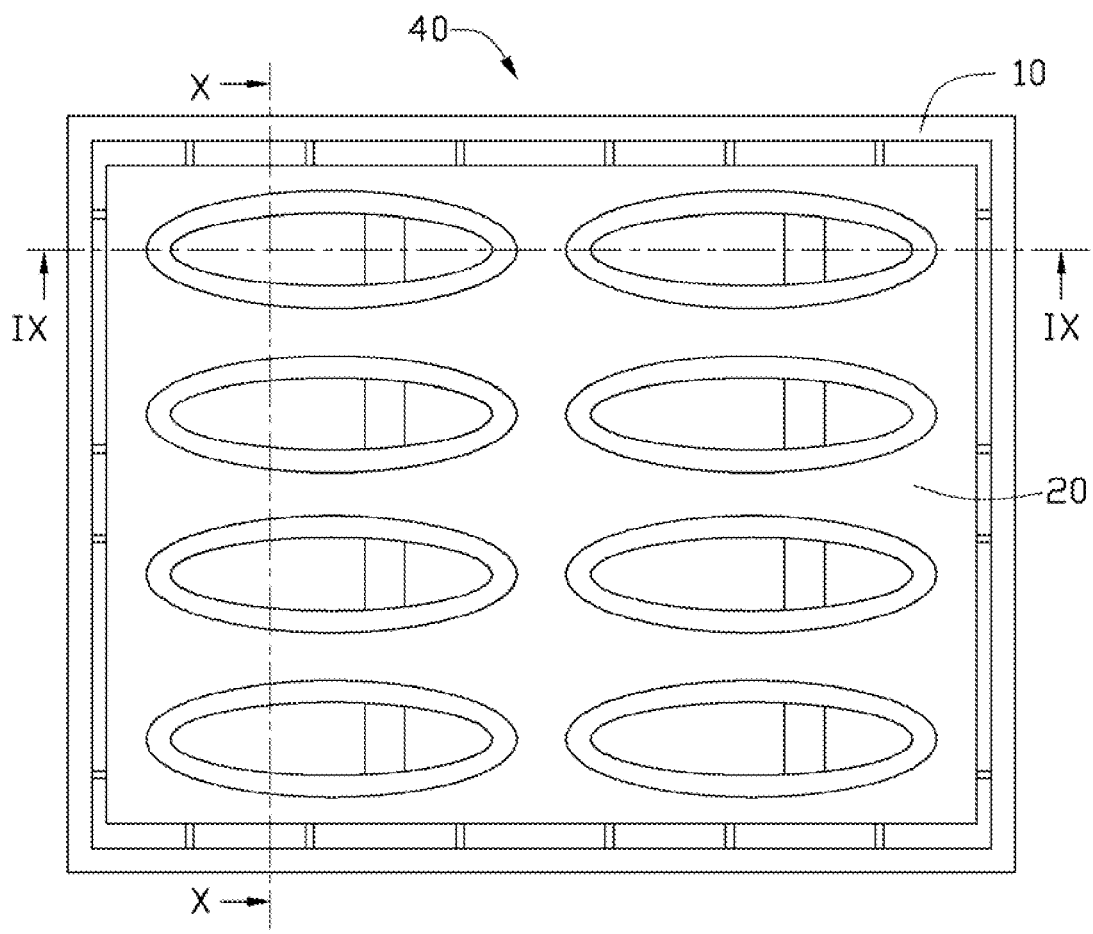
FIG. 8 is a top plan view of a packaging structure according to a third step of the method for manufacturing the LED package.
Figure 9:
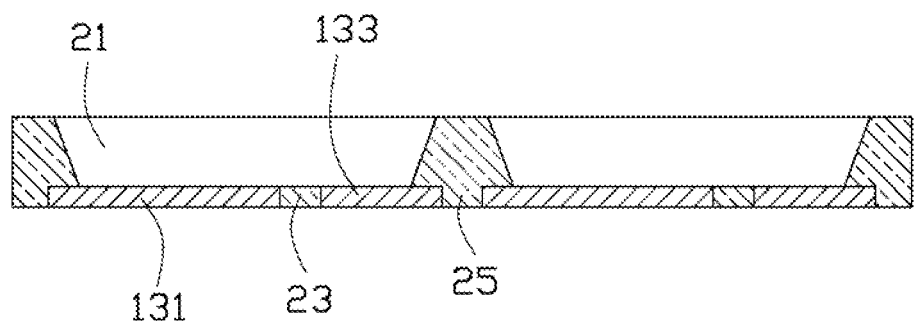
FIG. 9 is a cross-sectional view of the packaging structure of FIG. 8, taken along line IX-IX thereof.
Figure 10:
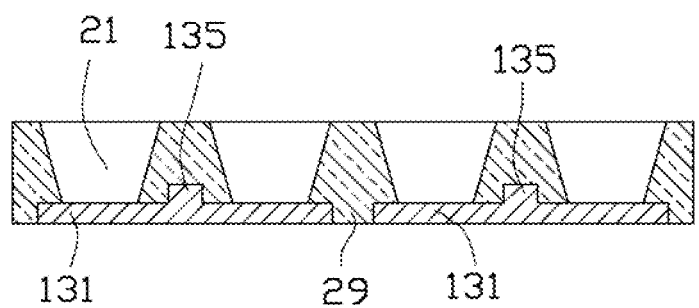
FIG. 10 is cross-sectional view of the packaging structure of FIG. 8, taken along line X-X thereof.

Referring to FIGS. 8-10, the third step is engaging the substrate 20 and the engaging frame 10 together to obtain a packaging structure 40. In detail, the third step is performed by aligning each first receiving cavity 27 of the substrate 20 with the corresponding first inserting parts 135 of the first electrode 131 and the corresponding second inserting parts 137 of the second electrode 133 which are aligned in a line along the longitudinal direction of the lead frame 11, and aligning the third insulating part 29 of the substrate 20 with the third receiving slot 145 simultaneously. Meanwhile, each first insulating part 23 of the substrate 20 is aligned with one corresponding first receiving slot 141 of the engaging frame 10, and the second insulating part 25 of the substrate 20 is aligned with the second receiving slot 143 of the engaging frame 10.

And then, the aligned substrate 20 and the engaging frame 10 are pressed toward each to combine together to obtain the packaging structure 40, with the aligned first inserting parts 135 and second inserting parts 137 of the engaging frame 10 received in one corresponding first receiving cavity 27 of the substrate 20, each first insulating part 23 of the substrate 20 received in one corresponding first receiving slot 141, the second insulating part 25 of the substrate 20 received in the second receiving slot 143, and the third insulating part 29 received in the third receiving slot 145. Meanwhile, the through holes 21 are located at lateral sides of the first inserting parts 135 and the second inserting parts 137 respectively. In this embodiment, bottom surfaces of each first electrode 131 and each second electrode 133 are exposed out of the substrate 20.

Figure 11:
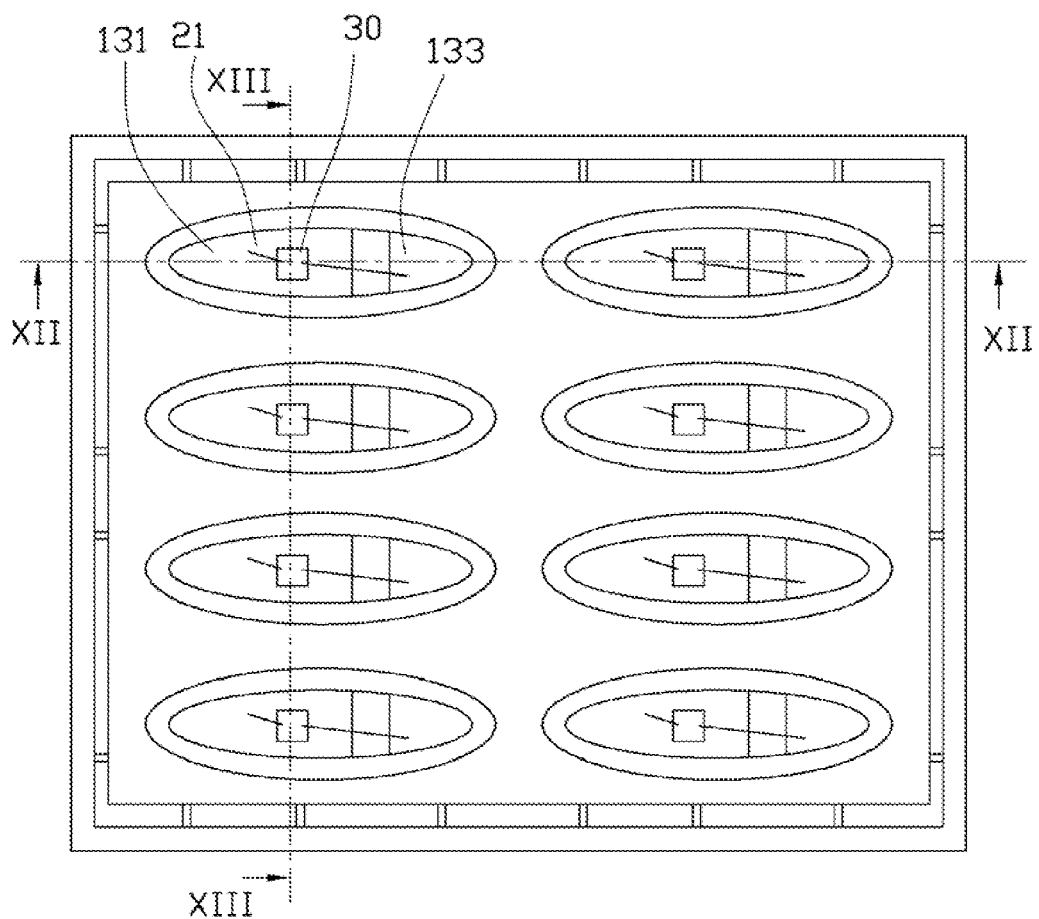
FIG. 11 is a top plan view of the packaging structure according to a fourth step of the method for manufacturing the LED package.
Figure 12:
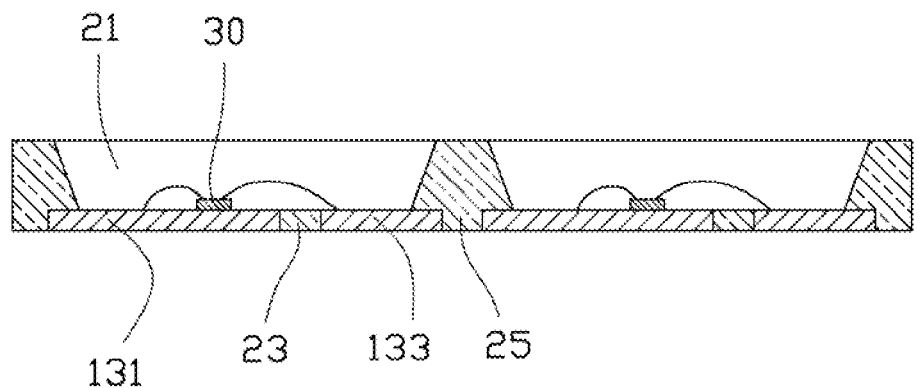
FIG. 12 is a cross-sectional view of FIG. 11, taken along line XII-XII thereof.
Figure 13:
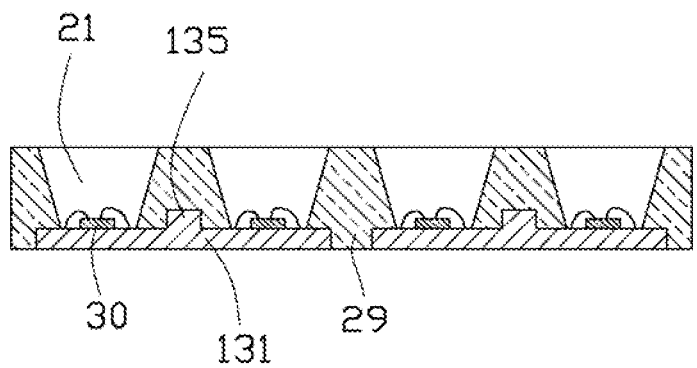
FIG. 13 is a cross-sectional view of FIG. 11, taken along line XIII-XIII thereof.

Referring to FIGS. 11-13, the fourth step is providing a plurality of LED diodes 30, and connecting electrically each of the LED diodes 30 to the first electrode 131 and the second electrode 133 respectively. In detail, the fourth step is performed by arranging each LED diode 30 on a top surface of one respective first electrode 131, and electrically connecting the LED diode 30 to the first electrode 131 and the second electrode 133 respectively. Alternatively, the LED diode 30 can be arranged on a top surface of the second electrode 135 or arranged on a top surface of the first insulating part 23.

Figure 14:
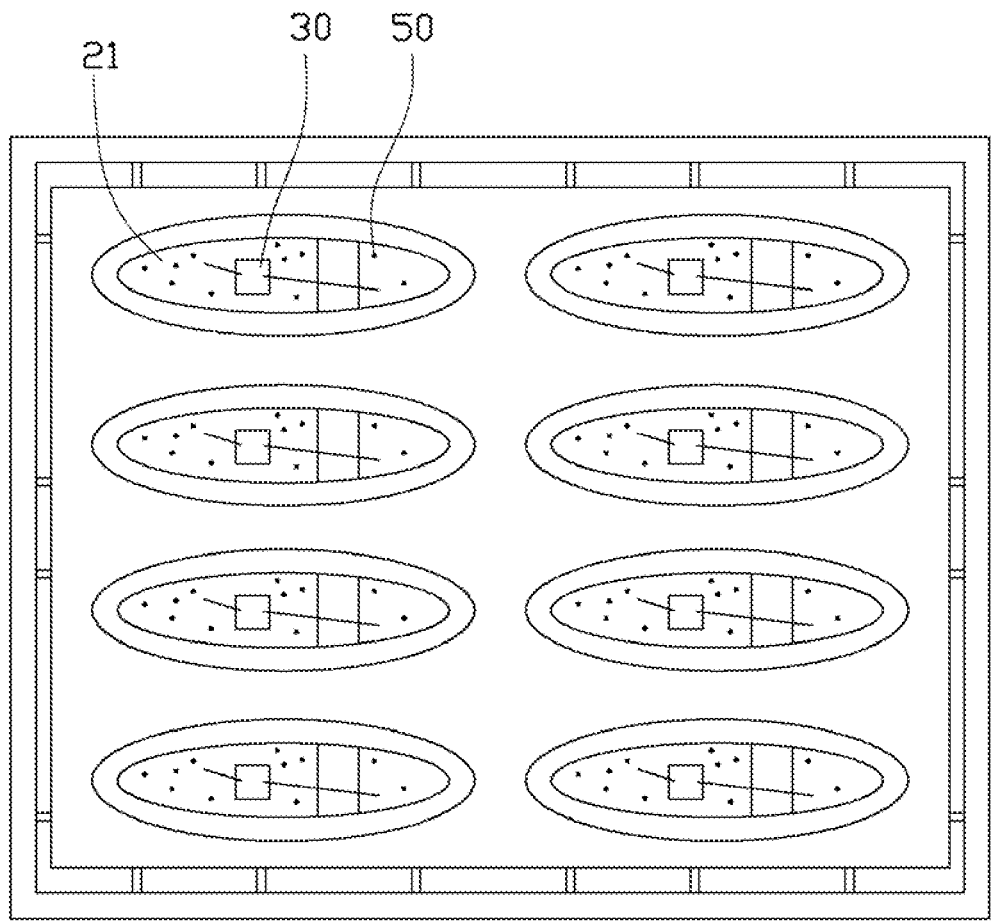
FIG. 14 is a top plane view of the packaging structure according to a fifth step of the method for manufacturing the LED package.

Referring to FIG. 14, the fifth step is forming an encapsulating layer 50 in each through hole 21 to encapsulate the LED chip 30.

Figure 15:
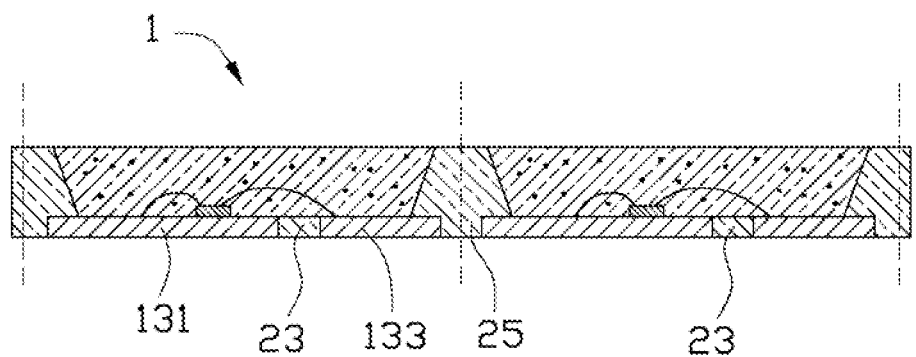
FIGS. 15-16 are cross-sectional views showing a sixth step of the method for manufacturing the LED package.
Figure 16:
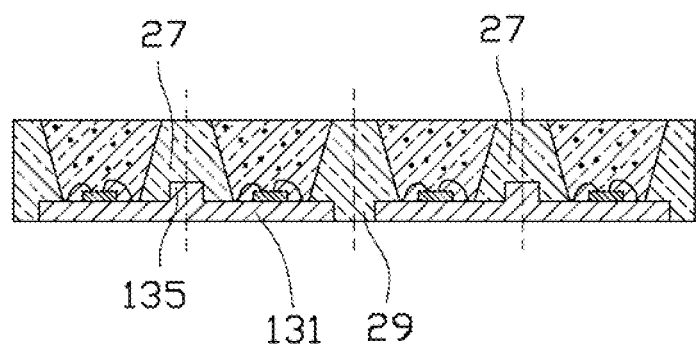

Referring to FIGS. 15-16, the sixth step is providing a cutting device (not shown), and cutting the packaging structure 40 to obtain a plurality of individual LED packages 1. In detail, the sixth step is performed by cutting the packaging structure 40 along the dashed lines shown in FIGS. 15-16 to obtain the plurality of individual LED packages 1, with a side face of the first electrode 131, a side face of the second electrode 133, a side face of the first inserting part 135 and a side face of the second inserting part 137 being exposed out of the substrate 20. By mounting the exposed side surfaces of the first and second electrodes 131, 133 and the first and second inserting parts 135, 137 to a printed circuit board (not shown), the LED package 1 can be a side view LED package (i.e., an illumination direction of the LED package 1 being parallel to an extension direction of the printed circuit board).

Figure 17:
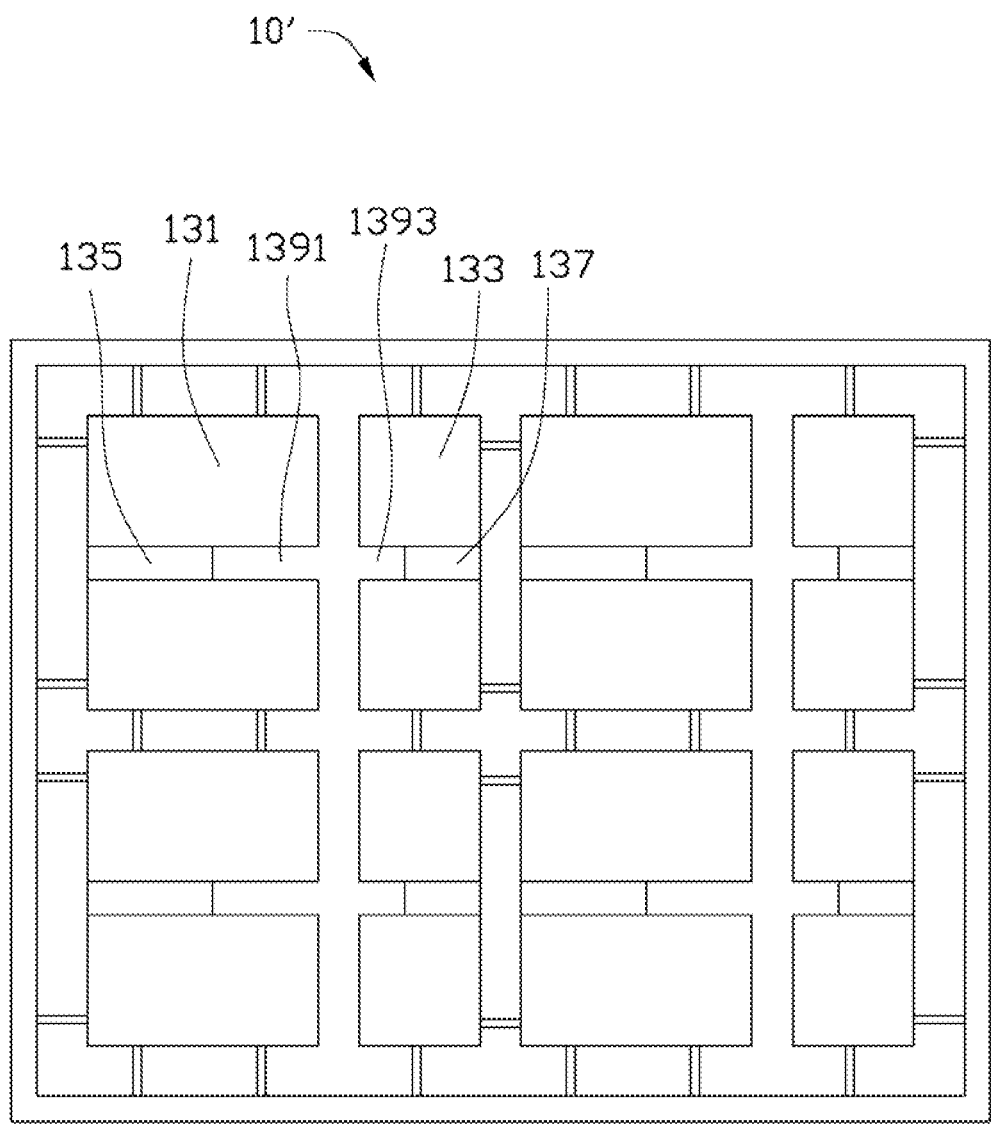
FIG. 17 is a top plan view of an engaging frame according to another exemplary embodiment of the present disclosure.

Referring to FIG. 17, in a second embodiment, an engaging frame 10' is provided, and what is different from the first embodiment is that a first gap 1391 is defined in the first electrode 131, and a second gap 1393 is defined in the second electrode 133. The first gap 1391 extends through the first electrode 131 from a top surface to a bottom surface thereof. The second gap 1393 extends through the first electrode 133 from a top surface to a bottom surface thereof. The first gap 1391 extends from a right end face of the first electrode 131 leftward along a longitudinal direction of the engaging frame 10' to reach the first inserting part 135, and the second gap 1393 extends from a left end face of the second electrode 133 rightward along the longitudinal direction of the engaging frame 10' to reach the second inserting part 137. The first gap 1391 and the second gap 1393 are aligned with each other, and communicated with one first receiving slot 141.

As such, the cutting device can be used to only cut the first inserting part 135, the second inserting part 137, part of the first electrode 131 under the first inserting part 135 and part of the second electrode 133 under the second inserting part 137 instead of cutting the first inserting part 135, the second inserting part 137, the entire first and second electrodes 131, 133, whereby the life span of the cutting device can be extended and the cutting process can be more easily completed.

According to the LED package 1 manufactured by the methods of above-described embodiments, when the LED package 1 is assembled with a the printed circuit board (not shown), the exposed side face of the first electrode 131 and the exposed side face of the second electrode 133 can be mounted on the printed circuit board. Because the exposed side face of the first inserting part 135 is coplanar with the exposed side face of the first electrode 131, and the exposed side face of the second part 137 is coplanar with the side face of the second electrode 133, a contact area of the first and second electrodes 131, 133 with the printed circuit board is increased, whereby the LED package 1 can be mounted on the printed circuit board firmly.

In addition, as the contact area is increased, the heat-dissipating area is also increased, whereby the heat-dissipating efficiency of the LED package 1 is increased to extend the life span of the LED package 1.

Furthermore, the exposed bottom surface of the first electrode 131 and the exposed bottom surface of the second electrode 133 enable the LED package 1 to be mounted on the printed circuit board by the exposed bottom surfaces of the first and second electrodes 131, 133, whereby the LED package 1 is used as a top view LED package. As such, the LED package 1 can be mounted in versatile mounting ways.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for manufacturing light emitting diode (LED) packages comprising following steps:
    providing an engaging frame, the engaging frame comprising a lead frame and a plurality of electrode structures enclosed by and connected to the lead frame, and defining a plurality of receiving slots between the electrode structures, each electrode structure comprising a first electrode having a first inserting part and a second electrode having a second inserting part;
    providing a substrate, the substrate comprising a plurality of insulating parts and defining a plurality of receiving cavities and through holes;
    engaging the substrate and the engaging frame together to make the through holes of the substrate located at lateral sides of the first inserting parts and the second inserting parts respectively, the insulating parts of the substrate received in the corresponding receiving slots of the engaging frame, the receiving cavities of the substrate receiving the corresponding first inserting parts and the second inserting parts;
    providing a plurality of LED diodes, and connecting each LED diode electrically to the first electrode and the second electrode respectively at a bottom end of each through hole;
    forming an encapsulating layer in each through hole to encapsulate the LED chip; and
    cutting along the first inserting parts and the second inserting parts to make a side of each of the first inserting parts and a side of each of the second inserting parts exposed to an external environment.

2. The method of claim 1, wherein each first inserting part extends upwardly and vertically from a central portion of a top surface of each first electrode, and each second inserting part extends upwardly and vertically from a central portion of a top surface of each second electrode.

3. The method of claim 2, wherein the first inserting part is aligned with the second inserting part.

4. The method of claim 3, wherein the first inserting part is integrally formed with the first electrode as a single monolithic piece, and the second inserting part is integrally formed with the second electrode as a single monolithic piece.

5. The method of claim 2, wherein a height of the first inserting part is larger than a height of the first electrode, and a height of the second inserting part is larger than a height of the second electrode.

6. The method of claim 5, wherein each first inserting part is a rectangular parallelepiped, and each second inserting part is a rectangular parallelepiped.

7. The method of claim 6, wherein a left end face of the first inserting part is coplanar with a left end face of the first electrode, a length of the first inserting part extending longitudinally toward a right end of the first electrode is shorter than that of the first electrode, a right end face of the second inserting part is coplanar with a right end face of the second electrode, and a length of the second inserting part extending longitudinally toward a left end of the second electrode is shorter than that of the second electrode.

8. The method of claim 7, wherein a first gap is defined in the first electrode, and a second gap is defined in the second electrode, the first gap extends from a right end face of the first electrode leftward to reach the first inserting part, the second gap extends from a left end face of the second electrode rightward to reach the second inserting part, and the first gap and the second gap are aligned with each other.

9. The method of claim 1, wherein the engaging frame further comprises a plurality of connecting bars, and the connecting bars connect the electrode structures to the lead frame.

10. The method of claim 1, wherein the cutting process also comprises a cutting through the substrate and the engaging frame along a path between two adjacent electrode structures and perpendicular to the extending direction of the first and second inserting parts, whereby an LED package obtained thereby comprises the first electrode with exposed bottom and side faces, the first inserting part with an exposed side face, the second electrode with exposed bottom and side faces and the second inserting part with an exposed side face, whereby the LED package is used as one of side view LED package and a top view LED package.

* * * * *